United States Patent
Lee et al.

(10) Patent No.: US 10,448,512 B2
(45) Date of Patent: Oct. 15, 2019

(54) PRINTED CIRCUIT BOARD

(71) Applicant: SAMSUNG ELECTRO-MECHANICS CO., LTD., Suwon-si (KR)

(72) Inventors: Doo Hwan Lee, Suwon-si (KR); Jong Rip Kim, Suwon-si (KR); Ung Hui Shin, Suwon-si (KR); Sung Hwan Cho, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 149 days.

(21) Appl. No.: 14/867,286

(22) Filed: Sep. 28, 2015

(65) Prior Publication Data
US 2016/0219711 A1    Jul. 28, 2016

(30) Foreign Application Priority Data
Jan. 22, 2015  (KR) .................. 10-2015-0010680

(51) Int. Cl.
*H05K 1/18* (2006.01)
*H05K 1/02* (2006.01)

(52) U.S. Cl.
CPC .......... *H05K 1/186* (2013.01); *H05K 1/0271* (2013.01); *H01L 2224/04105* (2013.01); *H01L 2924/3511* (2013.01); *H05K 2201/0133* (2013.01); *H05K 2201/0187* (2013.01)

(58) Field of Classification Search
CPC ............ H05K 1/14; H05K 1/141–144; H05K 1/182–188; H01L 23/5389
USPC .......... 361/760–767, 792–795; 174/259–264
See application file for complete search history.

(56) References Cited

U.S. PATENT DOCUMENTS

| | | | |
|---|---|---|---|
| 4,970,624 A | 11/1990 | Arneson et al. | |
| 6,370,013 B1 * | 4/2002 | Iino | H01G 4/2325 257/E23.062 |
| 6,876,554 B1 * | 4/2005 | Inagaki | H01G 4/224 257/E23.062 |
| 7,550,320 B2 * | 6/2009 | Wang | H05K 1/186 438/106 |
| 8,206,530 B2 | 6/2012 | Lee et al. | |
| 8,299,366 B2 * | 10/2012 | Sato | H01L 23/5389 174/256 |

(Continued)

FOREIGN PATENT DOCUMENTS

CN    1867224 A   11/2006
CN    101951733 A   1/2011
(Continued)

OTHER PUBLICATIONS

Chinese Office Action dated Oct. 8, 2018 in corresponding Chinese Patent Application No. 201510642523.0 (17 pages in English and 10 pages Chinese).

*Primary Examiner* — Tuan T Dinh
(74) *Attorney, Agent, or Firm* — NSIP Law

(57) ABSTRACT

There are provided a printed circuit board and a method to manufacture the same. The printed circuit board includes a core board including an insulating layer and a cavity, an electronic element in the cavity, and an insulating member disposed between inner surfaces of the cavity and the electronic element. A modulus of elasticity of the insulating member is lower than a modulus of elasticity of the insulating layer.

14 Claims, 12 Drawing Sheets

(56) References Cited

U.S. PATENT DOCUMENTS

| | | | |
|---|---|---|---|
| 2005/0122698 A1* | 6/2005 | Ho | H01L 23/5389 361/761 |
| 2006/0042078 A1 | 3/2006 | Takeuchi et al. | |
| 2006/0145328 A1* | 7/2006 | Hsu | H01L 23/5389 257/690 |
| 2006/0260122 A1 | 11/2006 | Honjo et al. | |
| 2008/0277150 A1* | 11/2008 | Takashima | H01L 21/4857 174/260 |
| 2009/0283895 A1* | 11/2009 | Kikuchi | H01L 23/5389 257/692 |
| 2010/0006203 A1* | 1/2010 | Lee | H01L 23/5389 156/60 |
| 2011/0100689 A1 | 5/2011 | Byun et al. | |
| 2011/0123808 A1* | 5/2011 | Lee | H05K 1/185 428/411.1 |
| 2012/0287586 A1* | 11/2012 | Mikado | H05K 1/185 361/748 |
| 2014/0083749 A1 | 3/2014 | Takizawa | |
| 2014/0151104 A1* | 6/2014 | Chung | H05K 1/186 174/260 |
| 2014/0182889 A1 | 7/2014 | Shin et al. | |

FOREIGN PATENT DOCUMENTS

| | | |
|---|---|---|
| CN | 102646628 A | 8/2012 |
| JP | 2009-218441 A | 9/2009 |
| JP | 2009-246315 A | 10/2009 |
| JP | 2013-179144 A | 9/2013 |
| KR | 10-2014-0039993 | 4/2014 |
| TW | 200614899 A | 8/1994 |
| TW | 201004504 A1 | 1/2010 |
| TW | 201414389 A | 4/2014 |
| TW | 201427527 A | 7/2014 |
| WO | WO 2014/051233 A2 | 4/2014 |

\* cited by examiner

PRINTED CIRCUIT BOARD

CROSS-REFERENCE TO RELATED APPLICATION

This application claims the priority and benefit under 35 USC 119(a) of Korean Patent Application No. 10-2015-0010680 filed on Jan. 22, 2015, with the Korean Intellectual Property Office, the disclosure of which is incorporated herein by reference.

BACKGROUND

1. Field

The following description relates to a printed circuit board and a method of manufacturing the same.

2. Description of Related Art

Higher functionality of today's portable devices demands smaller, lighter, and thinner electronic components. Looking at the evolution of package miniaturization, the technology has gone from two-dimensional to three-dimensional packaging achieving high density packages. However, few existing components are manufactured with purpose of being embedding into printed circuit boards, and there is limited data confirming the reliability of embedded components.

Thus, a need exists of developing new technology to increase the functionality of printed circuit boards, allowing the printed circuit boards to perform an electrical role by active devices or passive devices embedded therein, and also perform several roles depending on devices embedded therein.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a printed circuit board, including: a core board including an insulating layer and a cavity; an electronic element in the cavity; and an insulating member disposed between inner surfaces of the cavity and the electronic element, wherein a modulus of elasticity of the insulating member is lower than a modulus of elasticity of the insulating layer.

The printed circuit board may also include a first insulating layer disposed on at least one of an upper surface and a lower surface of the core board to cover the at least one of the upper surface and the lower surface of the electronic element.

The insulating member may exclude a glass fiber, and the first insulating layer includes a glass fiber.

The printed circuit board may also include a second insulating layer disposed on the first insulating layer.

The printed circuit board may also include a second insulating layer disposed on another surface of the core board that excludes the first insulating layer.

At least one of the insulating member and the first insulating layer may include a modulus of elasticity and a coefficient of thermal expansion lower than a modulus of elasticity and a coefficient of thermal expansion of the second insulating layer.

At least one of the insulating member and the first insulating layer may have a modulus of elasticity and a coefficient of thermal expansion lower than a modulus of elasticity and a coefficient of thermal expansion of the second insulating layer.

The insulating member may be disposed on one surface of the core board and includes a curved portion between the inner surfaces of the cavity and the electronic element.

In accordance with another embodiment, there is provided a method to manufacture a printed circuit board, the method including: preparing a core board including a cavity; accommodating an electronic element in the cavity; and forming an insulating member between inner surfaces of the cavity and the electronic element, wherein a modulus of elasticity of the insulating member is lower than a modulus of elasticity of an insulating layer of the core board.

The method may also include forming a first insulating layer on at least one of an upper surface and a lower surface of the core board to cover the at least one of the upper surface and the lower surface of the electronic element.

The insulating member may exclude a glass fiber, and the first insulating layer includes a glass fiber.

The method may also include forming a second insulating layer on the first insulating layer.

The method may also include forming a second insulating layer on the other surface of the core board that excludes the first insulating layer.

At least one of the insulating member and the first insulating layer may include a modulus of elasticity and a coefficient of thermal expansion lower than a modulus of elasticity and a coefficient of thermal expansion of the second insulating layer.

At least one of the insulating member and the first insulating layer may have a modulus of elasticity and a coefficient of thermal expansion lower than a modulus of elasticity and a coefficient of thermal expansion of the second insulating layer.

The accommodating of the electronic element and the forming of the insulating member may include bonding the insulating member to an upper surface of the core board, the insulating member having an opening positioned in an upper portion of the cavity; and accommodating the electronic element in the cavity through the opening of the insulating member while a portion of the insulating member is curved.

The opening may include a radial shape.

The opening may include through-holes at tips of the radial shape and corresponds to alignment marks of the electronic element.

In accordance with another embodiment, there is provided a printed circuit board, including: an insulating layer on a core board; an electronic element accommodated in a cavity surrounded by and spaced apart from the insulating layer; and an insulating member formed between inner surfaces of the insulating layer and side surfaces of the electronic element to secure the electronic member to the core board, wherein the insulating member includes a lower modulus of elasticity than the insulating layer.

The printed circuit board may also include a circuit pattern formed on a main surface of the electronic element.

The printed circuit board may also include a first insulating layer formed on an upper surface of the core board and covering at least a portion of an upper surface of the electronic element; and a second insulating layer formed on a lower surface of the core board and covering a lower surface of the insulating member.

The modulus of elasticity and a coefficient of thermal expansion of the insulating member may be lower than the first insulating layer and the second insulating layer.

The modulus of elasticity and a coefficient of thermal expansion of the insulating member may be equal to the first insulating layer, and lower than the second insulating layer.

At least one of the insulating member and the first insulating layer may have a modulus of elasticity and a coefficient of thermal expansion lower than a modulus of elasticity and a coefficient of thermal expansion, respectively, of the second insulating layer.

The modulus of elasticity and a coefficient of thermal expansion of the insulating member may be lower than a modulus of elasticity and a coefficient of thermal expansion of the first insulating layer and the second insulating layer, respectively.

The modulus of elasticity and a coefficient of thermal expansion of the insulating member may be equal to a modulus of elasticity and a coefficient of thermal expansion of the first insulating layer, respectively, and lower than a modulus of elasticity and a coefficient of thermal expansion of the second insulating layer, respectively.

The first insulating layer may include upper and lower first insulating layers formed on both surfaces of the core board to cover an upper surface and a lower surface, respectively, of the electronic element.

The first insulating layer may include upper and lower first insulating layers formed on both surfaces of the core board to cover an upper surface and a lower surface, respectively, of the electronic element.

In accordance with an embodiment, there is provided a printed circuit board, including: an insulating layer on a core board; an electronic element accommodated in a cavity surrounded by and spaced apart from the insulating layer; a circuit pattern disposed on a surface of the insulating layer; and an insulating member formed between inner surfaces of the insulating layer and side surfaces of the electronic element to secure the electronic member to the core board, forming a curved portion between the insulating layer and the electronic element, and continuously wrapping over an upper surface of the insulating layer, the insulating member including a lower modulus of elasticity than the insulating layer.

The printed circuit board may also include second insulating layers formed on both surfaces of the core board, and configured to cover the circuit pattern, the insulating member, the insulating layer, and the electronic element.

The insulating member may include the modulus of elasticity and a coefficient of thermal expansion lower than a modulus of elasticity and a coefficient of thermal expansion of the second insulating layer.

The insulating member may be configured to be formed to cover an entirety of an upper surface of the core board, excluding an upper surface of the electronic element or may be configured to be formed on portions of the upper surface of the core board between circuit patterns formed on the insulating layer.

The insulating member may include an opening positioned in an upper portion of the cavity of the core board and configured to receive and secure the electronic element to the core board.

The opening of the insulating member may have a radial shape and through-holes formed at tips of the radial shape and corresponding to alignment marks of the electronic element.

The printed circuit board may also include an adhesive sheet configured to support the core board and the electronic element.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
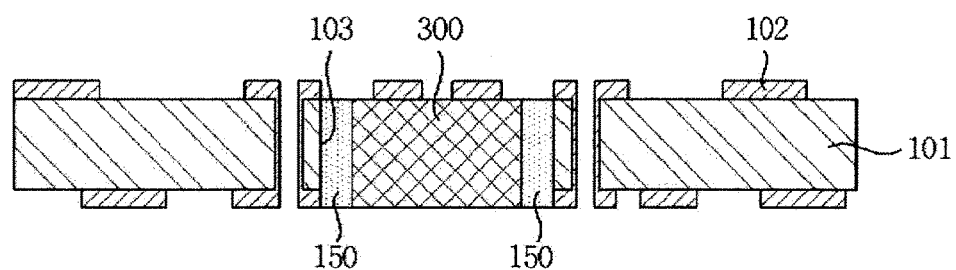
FIG. 1 is a cross-sectional view illustrating a printed circuit board, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a printed circuit board, according to an embodiment.

Referring to FIG. 1, the printed circuit board includes a core board including an insulating layer 101 and having a cavity 103, an electronic element 300 accommodated in the cavity 103, and an insulating member 150 formed between inner surfaces of the cavity 103 and outer side surfaces of the electronic element 300.

In one example, the insulating member 150 has a modulus of elasticity lower than that of the insulating layer 101 of the core board.

The core board is a double-sided printed circuit board having circuit patterns 102 formed on both surfaces of the insulating layer 101. However, the core board is not limited thereto, and may be a multilayer printed circuit board including a plurality of circuit patterns, each with similar configuration as the circuit patterns 102, and a plurality of insulating layers, each with similar configuration as the insulating layer 101, interposed between the plurality of circuit patterns in order to insulate the plurality of circuit patterns from each other.

The core board may also include blind vias and through-vias connecting interlayer circuit patterns to each other, if necessary.

The insulating layer 101 is formed of any insulating resin generally used as an insulating material in printed circuit boards. For example, a thermosetting resin such as an epoxy resin, a thermoplastic resin such as polyimide, or a resin prepared by impregnating a reinforcing material, such as a glass fiber or an inorganic filler with the thermosetting resin or the thermoplastic resin may be used therefor.

The circuit pattern is formed of any material used as a conductive material for circuits in printed circuit boards. For example, the circuit pattern may be formed of copper (Cu).

The electronic element 300 is not particularly limited, but may be a general active device or a general passive device. In addition, the electronic element 300 may be any electronic component to be mounted on or embedded in a printed circuit board. The electronic element 300 is accommodated in the cavity 103 surrounded by and spaced apart from the insulating layer 101.

The circuit patterns or electrodes 102 are formed on a main surface of the electronic element 300. The electronic element 300 is accommodated in the cavity to be embedded in the core board such that the main surface thereof is directed upwardly.

The insulating member 150 is formed in a space between the inner surfaces of the cavity 103 and side surfaces of the electronic element 300. In other words, the insulating member 150 is formed between inner walls of the insulating layer 101 and side surfaces of the electronic element 300.

The insulating member 150 is formed of an insulating material having a modulus of elasticity lower than that of the insulating layer 101 of the core board. For example, a resin having a low modulus of elasticity may be used.

For example, the modulus of elasticity of the insulating member 150 may be about 1/10 or less of that of the insulating layer 101. In another example, the insulating member 150 may also have a modulus of elasticity of about 10 GPa or less.

As previously explained, the insulating member 150 is formed in the space between the inner surfaces of the cavity 103 and the side surfaces of the electronic element 300 to fix the electronic element 300 to the core board. In addition, because the insulating member 150 has the low modulus of elasticity, the insulating member 150 is very elastic and is able to deform to control warpage of the printed circuit board. The warpage is generated during a heat treatment and/or a cooling operation after the heat treatment in a process to manufacture the printed circuit board.

Generally, an electronic element on which electrodes are formed is positioned at a location of a printed circuit board in which the electronic element is to be embedded. In one example, a passivation (PSV) material is used in the vicinity of the electrodes, and the PSV material generally has a thickness of about 10 μm. As the PSV material, polyimide may be used, and a material used on a semiconductor wafer level package, such as benzocyclobutene-based polymers (BCB) or $Si_3N_4$, may also be used.

However, when the PSV material is used, in a case of a relatively thin device having a thickness of about 100 μm, a ratio of the PSV material to a thickness of the electronic element may be increased, and differences in a coefficient of thermal expansion and a modulus of elasticity between the PSV material and Si used as a base material of the electronic element may be increased. Therefore, even in a case of grinding a rear surface of the electronic element in which the PSV material is used, warpage may be generated in the rear surface of the electronic element when the electronic element is mounted on the printed circuit board. In addition, when the electronic element in which the PSV material is used is embedded in the printed circuit board, a difference in physical mechanical properties between the electronic element and an interior material of the printed circuit board may result in warpage to be generated in the printed circuit board.

According to an embodiment, the insulating member 150 having the low modulus of elasticity, as described above, is used to alleviate stress in an upper portion of the electronic element 300 in a manner such that a main surface of the electronic element 300 is directed upwardly, thereby decreasing contraction stress on the electronic element 300 after being embedded in the core board. The main surface of the electronic element 300 is an upper surface thereof onto which the circuit patterns 102 or electrodes are formed. Furthermore, warpage is suppressed and controlled on the overall printed circuit board.

Further, although not illustrated, a build-up layer is formed on the core board, and a via connecting the build-up layer to the circuit pattern 102 or the electronic element 300 is formed.

Furthermore, another electronic device or electronic structural package may be mounted in the printed circuit board, and the printed circuit board may also be mounted on a main board.

In one example, the printed circuit board electrically connects an electronic device or electronic structural package to the main board.

Figure 2:
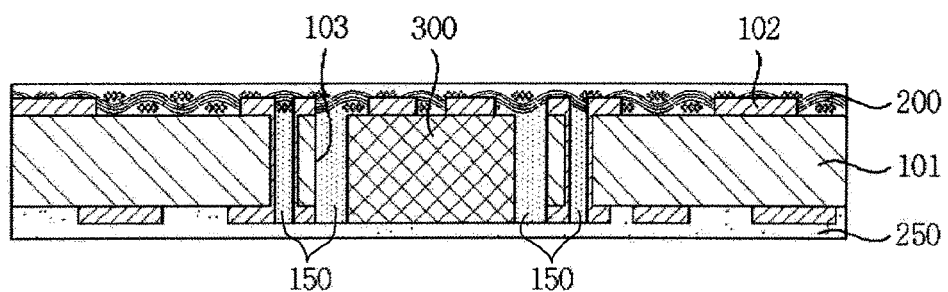
FIG. 2 is a cross-sectional view illustrating a printed circuit board, according to another embodiment.

FIG. 2 is a cross-sectional view illustrating a printed circuit board, according to another embodiment.

Referring to FIG. 2, the printed circuit board includes a core board including an insulating layer 101, circuit patterns 102, a cavity 103, an electronic element 300 accommodated in the cavity 103, an insulating member 150 formed in a space between inner surfaces of the cavity 103 and the electronic element 300, and a first insulating layer 200 formed on an upper surface of the core board to cover an upper surface of the electronic element 300.

In addition, a second insulating layer 250 is formed on a lower surface of the core board, on which the first insulating layer 200 is not formed.

In one example, the insulating member 150 and/or the first insulating layer 200 have a modulus of elasticity lower than that of the insulating layer 101 of the core board. The insulating member 150 and/or the first insulating layer 200 have a modulus of elasticity and a coefficient of thermal expansion lower than those of the second insulating layer 250. In another configuration, the modulus of elasticity and the coefficient of thermal expansion of the insulating member 150 are lower than the first insulating layer 200 and the second insulating layer 250. In another example, the modulus of elasticity and the coefficient of thermal expansion of the insulating member 150 are equal to the first insulating layer 200, but lower than the second insulating layer 250. In a further example, the modulus of elasticity and the thermal expansion of the insulating member 150, the first insulating layer 200, and the second insulating layer 250 are substantially the same.

In a further configuration, the insulating member 150 and the first insulating layer 200 are formed of an insulating material having a modulus of elasticity lower than that of the insulating layer 101 of the core board and the second insulating layer 250. For example, a resin having a low modulus of elasticity may be used.

The first insulating layer 200 is made, for example, of a glass fiber impregnated with resin, such as a prepreg. As illustrated in FIG. 2, the glass fiber impregnated with resin is disposed in contact with the insulating layer 101 of the core board and a surface of the electronic element 300 on which circuit patterns or electrodes 102 are disposed.

In the embodiment illustrated in FIG. 2, the insulating member 150 formed in the space between the inner surfaces of the cavity 103 and the side surfaces of the electronic element 300 does not include a glass fiber, while the first insulating layer 200 formed on the upper surface of the core board does include a glass fiber. In other words, the insulating member 150 is formed between inner walls of the insulating layer 101 and side surfaces of the electronic element 300.

In one example, the modulus of elasticity of the insulating member 150 and/or the first insulating layer 200 are about 1/10 or less than that of the second insulating layer 250. For example, the insulating member 150 and/or the first insulating layer 200 have a modulus of elasticity of about 10 GPa or less.

Because the insulating member 150 and/or the first insulating layer 200 have the low modulus of elasticity, lower than at least one of the second insulating layer 250 and the insulating layer 101, the insulating member 150 and/or the first insulating layer 200 are very elastic and able to deform. As a result, the insulating member 150 and/or the first insulating layer 200 are not significantly affected by contractions or deformations of the insulating layer 101 of the core board and the second insulating layer 250 of the printed circuit board. Thus, the insulating member 150 and/or the first insulating layer 200 are configured to control warpage of the printed circuit board.

Furthermore, as a result of the first insulating layer 200 having the coefficient of thermal expansion lower than that of the second insulating layer 250, the first insulating layer 200 is configured to control warpage generated in a main surface of the electronic element 300.

The second insulating layer 250 is formed on a surface of the core board on which the insulating member 150 is not formed. The second insulating layer 250 is formed of any insulating resin generally used as an interlayer insulating material in the printed circuit board. For example, the second insulating layer 250 is formed a thermosetting resin, such as an epoxy resin, a thermoplastic resin, such as polyimide, or a resin prepared by impregnating a reinforcing material, such as a glass fiber or an inorganic filler, with the thermosetting resin or the thermoplastic resin. Also, the second insulating layer 250 may be formed of a resin, such as a prepreg, ABF, FR-4, or BT.

In one example, although not illustrated, a build-up layer is formed on the first insulating layer 200 and the second insulating layer 250, and vias connecting the build-up layer to the circuit pattern 102 or the electronic element 300 may be formed. The electronic element 300 is accommodated in the cavity 103 surrounded by and spaced apart from the insulating layer 101.

Furthermore, an electronic device or electronic structural package is mounted in the printed circuit board, and the printed circuit board is mounted on a main board. In this example, the printed circuit board electrically connects another device or electronic structural package to the main board.

According to an embodiment, the insulating member 150 and the first insulating layer 200 covering the side surfaces and the upper surface of the electronic element 300 accommodated in the cavity 103 alleviate stress in an upper portion of the electronic element 300 in a manner such that the main surface of the electronic element 300 is directed upwardly, thereby decreasing contraction stress on the electronic element 300. Furthermore, warpage is suppressed and controlled on the overall printed circuit board.

Figure 3:
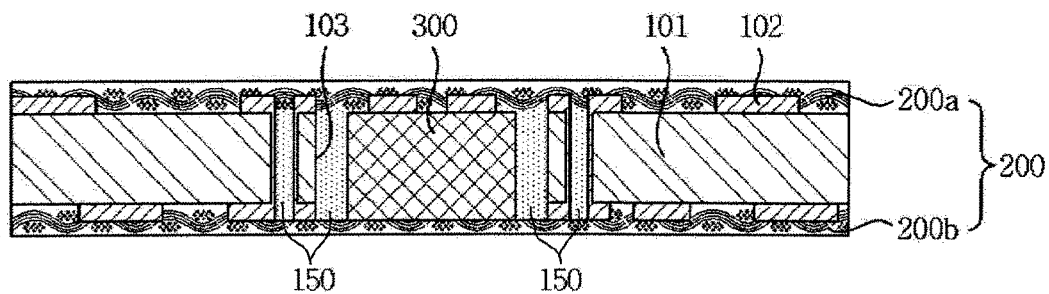
FIG. 3 is a cross-sectional view illustrating a printed circuit board, according to another embodiment.

FIG. 3 is a cross-sectional view illustrating a printed circuit board, according to another embodiment.

Referring to FIG. 3, the printed circuit board includes a core board including an insulating layer 101 and circuit patterns 102, a cavity 103, an electronic element 300 accommodated in the cavity 103, an insulating member 150 formed in a space between inner surfaces of the cavity 103 and the electronic element 300, and a first insulating layer 200. The first insulating layer 200 includes upper and lower first insulating layers 200*a* and 200*b* formed on both surfaces of the core board to cover an upper surface and a lower surface, respectively, of the electronic element 300.

The insulating member 150 is formed of an insulating material having a modulus of elasticity lower than the modulus of elasticity of the insulating layer 101 of the core board. For example, a resin having a low modulus of elasticity may be used.

The upper and lower first insulating layers 200a and 200b may be formed of a glass fiber impregnated with resin, such as a prepreg.

In one illustrative example, the insulating member 150 formed in the space between the inner surface of the cavity 103 and the side surfaces of the electronic element 300 does not contain or include a glass fiber, while the upper and lower first insulating layers 200a and 200b of the first insulating layer 200 contain a glass fiber.

For example, the modulus of elasticity of the insulating member 150 and/or the upper and lower first insulating layers 200a and 200b are about 1/10 or less of that of the insulating layer 101. In another example, the modulus of elasticity of the insulating member 150 is about 1/10 or less of those of the upper and lower first insulating layers 200a and 200b, which in turn are about 1/10 or less of that of the insulating layer 101. In one configuration, the upper and lower first insulating layers 200a and 200b have substantially the same modulus of elasticity. In another configuration, the upper first insulating layer 200a has a modulus of elasticity that may be lower or higher than the lower first insulating layer 200b, while still being lower than the modulus of elasticity of the insulating layer 101. The insulating member 150 and/or the upper and lower first insulating layers 200a and 200b have a modulus of elasticity of about 10 GPa or less.

Because the insulating member 150 and/or the upper and lower first insulating layers 200a and 200b have a lower modulus of elasticity than the insulating layer 101 of the printed circuit board, the insulating member 150 and/or the upper and lower first insulating layers 200a and 200b are flexible and not significantly affected by contraction of the insulating layer 101 of the printed circuit board of the core board. As a result, the insulating member 150 and/or the upper and lower first insulating layers 200a and 200b control warpage of the printed circuit board.

Meanwhile, although not illustrated, a build-up layer is formed on the first insulating layers 200a and 200b, and vias connecting the build-up layer to the circuit pattern 102 or the electronic element 300 are formed.

Furthermore, another device or electronic structural package may be mounted on the printed circuit board, and the printed circuit board may also be mounted on a main board.

In this case, the printed circuit board serves to electrically connect another electronic device or electronic structural package to the main board.

According to an embodiment, the insulating member 150 and the upper and lower first insulating layers 200a and 200b covering the side surfaces and the upper and lower surfaces of the electronic element 300, as described above, are configured to alleviate stress in upper and lower portions of the electronic element 300 when the electronic element 300 is accommodated in the cavity 103. As a result, the main surface of the electronic element 300 is directed upwardly, thus, decreasing contraction stress after the electronic element is embedded in the core board. Furthermore, warpage of the printed circuit board is suppressed and controlled by the configuration of the insulating member 150 and the upper and lower first insulating layers 200a and 200b.

Figure 4:
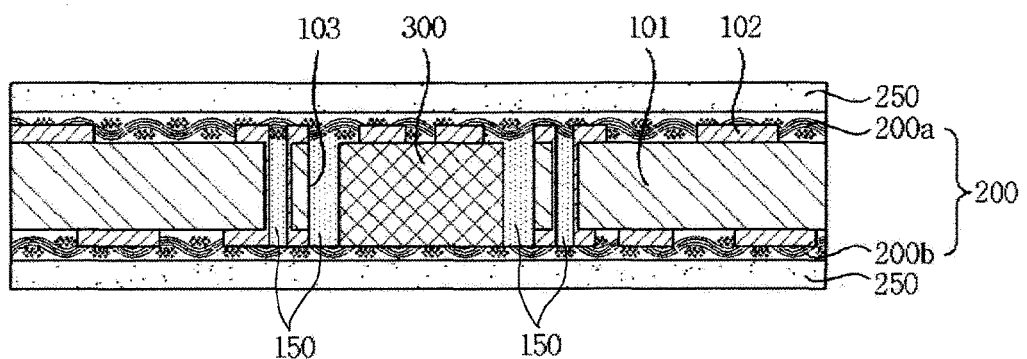
FIG. 4 is a cross-sectional view illustrating a printed circuit board, according to another embodiment.

FIG. 4 is a cross-sectional view illustrating a printed circuit board, according to another embodiment.

Referring to FIG. 4, the printed circuit board includes a core board including an insulating layer 101 and circuit patterns 102 disposed on upper and lower surfaces of the insulating layer 101. The core board also includes a cavity 103, an electronic element 300 accommodated in the cavity 103, an insulating member 150 formed in a space between inner surfaces of the cavity 103 and the electronic element 300, upper and lower first insulating layers 200a and 200b formed on both surfaces of the core board to cover an upper surface and a lower surface of the electronic element 300, and second insulating layers 250 formed on the first insulating layers 200a and 200b.

The second insulating layers 250 are formed on each of the upper and lower first insulating layers 200a and 200b, so that a double insulating layer structure is formed.

In one configuration, the insulating member 150 and/or the upper and lower first insulating layers 200a and 200b have a modulus of elasticity lower than that of the insulating layer 101. The insulating member 150 and/or the upper and lower first insulating layers 200a and 200b have a modulus of elasticity and a coefficient of thermal expansion lower than those of the second insulating layers 250.

The insulating member 150 and the upper and lower first insulating layers 200a and 200b may be formed of an insulating material having a modulus of elasticity lower than those of the insulating layer 101 of the core board and the second insulating layers 250. For example, a resin having a low modulus of elasticity may be used.

In an embodiment, the upper and lower first insulating layers 200a and 200b have substantially the same modulus of elasticity and/or coefficient of thermal expansion. In another configuration, the upper first insulating layer 200a has a modulus of elasticity and/or coefficient of thermal expansion that may be lower or higher than the lower first insulating layer 200b, while still being lower than the modulus of elasticity of the insulating layer 101 and the modulus of elasticity and/or coefficient of thermal expansion of the second insulating layers 250.

The upper and lower first insulating layers 200a and 200b are made of a glass fiber impregnated with resin, such as a prepreg.

In one example, the insulating member 150 formed in the space between the inner surfaces of the cavity 103 and the side surfaces of the electronic element 300 do not contain a glass fiber, while the first insulating layers 200a and 200b formed on both surfaces of the core board contain a glass fiber.

For example, the modulus of elasticity of the insulating member 150 and/or the upper and lower first insulating layers 200a and 200b are about 1/10 or less of that of the second insulating layers 250. In another example, the modulus of elasticity of the insulating member 150 is about 1/10 or less of those of the upper and lower first insulating layers 200a and 200b, which in turn are about 1/10 or less of those of the second insulating layers 250. For example, the insulating member 150 and/or the upper and lower first insulating layers 200a and 200b also have a modulus of elasticity of about 10 GPa or less.

Because the insulating member 150 and/or the upper and lower first insulating layers 200a and 200b have a lower modulus of elasticity than the insulating layer 101 of the printed circuit board, the insulating member 150 and/or the upper and lower first insulating layers 200a and 200b are flexible and not significantly affected by contraction of the insulating layer 101 of the core board and the second insulating layers 250, of the printed circuit board. As a result, the insulating member 150 and/or the upper and lower first insulating layers 200a and 200b control warpage of the printed circuit board.

The insulating member 150 and the upper and lower first insulating layers 200a and 200b are formed of an insulating material having a coefficient of thermal expansion lower than that of the second insulating layers 250. For example, a resin having a low coefficient of thermal expansion may be used.

As described above, the insulating member 150 and the upper and lower first insulating layers have the coefficient of thermal expansion lower than that of the second insulating layers 250, thereby controlling warpage generated in a main surface of the electronic element.

The second insulating layers 250 are formed of any insulating resin generally used as an interlayer insulating material in the printed circuit board. For example, the second insulating layers 250 are made of a thermosetting resin such as an epoxy resin, a thermoplastic resin, such as polyimide, or a resin prepared by impregnating a reinforcing material, such as a glass fiber, or an inorganic filler with the thermosetting resin or the thermoplastic resin. For example, the second insulating layers 250 are formed of a resin, such as a prepreg, ABF, FR-4, or BT.

In addition, although not illustrated, a build-up layer is formed on the second insulating layers 250, and vias connecting the build-up layer to the circuit pattern 102 or the electronic element 300 are formed.

Furthermore, another device or electronic structural package may be mounted on the printed circuit board, and the printed circuit board may also be mounted on a main board.

In this case, the printed circuit board serves to electrically connect another electronic device or electronic structural package to the main board.

According to an embodiment, the insulating member 150 and the upper and lower first insulating layers 200a and 200b covering the side surfaces and the upper and lower surfaces of the electronic element 300, as described above, are configured to alleviate stress in upper and lower portions of the electronic element 300 when the electronic element 300 is accommodated in the cavity 103. As a result, the main surface of the electronic element 300 is directed upwardly, thus, decreasing contraction stress after the electronic element is embedded in the core board. Furthermore, warpage of the printed circuit board is suppressed and controlled by the configuration of the insulating member 150 and the upper and lower first insulating layers 200a and 200b.

Figure 5:
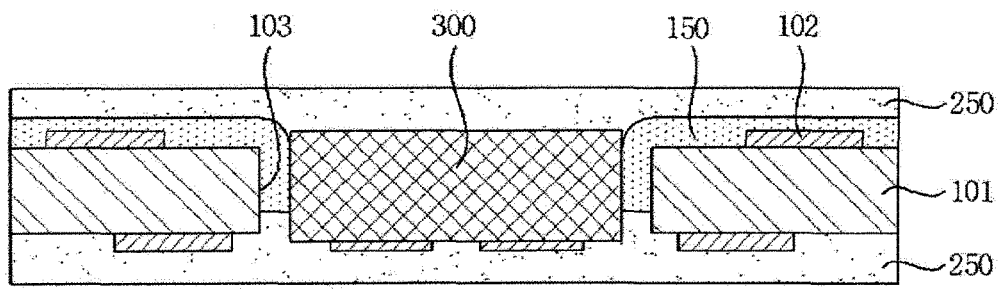
FIG. 5 is a cross-sectional view illustrating a printed circuit board, according to another embodiment.

FIG. 5 is a cross-sectional view illustrating a printed circuit board, according to another embodiment.

Referring to FIG. 5, the printed circuit board includes a core board including an insulating layer 101 and circuit patterns 102 disposed on upper and lower surfaces of the insulating layer 101. The core board also includes a cavity 103, an electronic element 300 accommodated in the cavity 103. An insulating member 150 is formed on one surface of the core board and in a space between inner surfaces of the cavity 103 and the electronic element 300 continuously wrapping over an upper surface of the insulating layer forming a curved portion between the insulating layer 101 and the electronic element 300. Second insulating layers 250 are formed on both surfaces of the core board in which the electronic element 300 is accommodated, covering the circuit patterns 102, the insulating member 150, the insulating layer 101, and the electronic element 300.

In one illustrative example, the insulating member 150 has a modulus of elasticity lower than that of the insulating layer 101. Further, the insulating member 150 has a modulus of elasticity and a coefficient of thermal expansion lower than those of the second insulating layer 250.

The electronic element 300 is accommodated in the cavity to be embedded in the core board in a manner such that a main surface thereof is directed downwardly.

The insulating member 150 is formed to cover an entirety of an upper surface of the core board, excluding an upper surface of the electronic element 300 or is formed on portions of the upper surface of the core board between circuit patterns 102 formed on the insulating layer 101. In an alternative embodiment, the insulating member 150 is formed to cover an entirety of an upper surface of the core board, excluding an upper surface where the electronic element 300 is placed. The insulating member 150 includes an opening 201 positioned in an upper portion of the cavity 103 of the core board. The opening 201 is configured to receive and keep in place in a fixed position the electronic element 300 accommodated in the cavity 103 (see also FIGS. 25 through 29).

Figure 26:
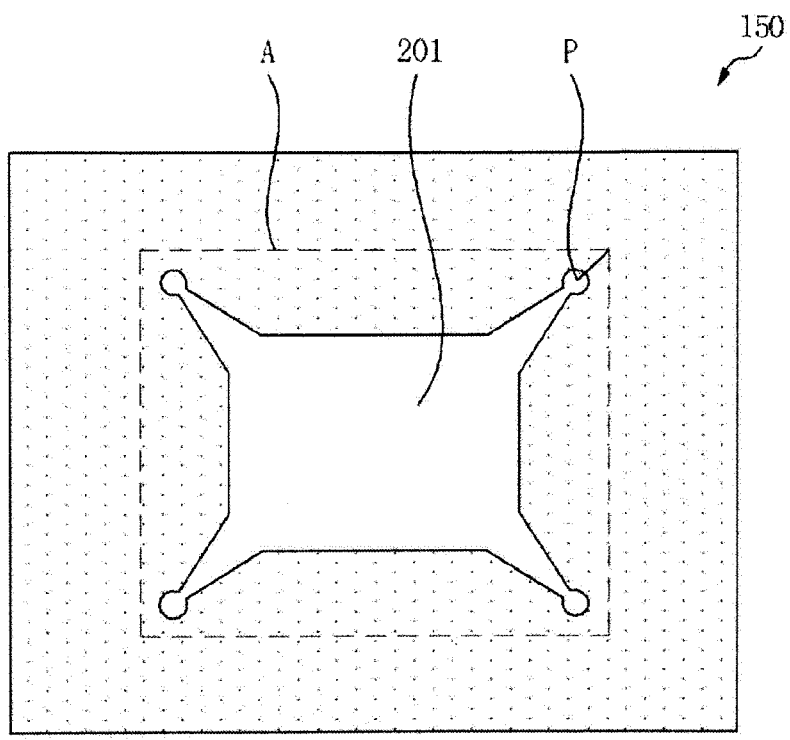
Figure 27:
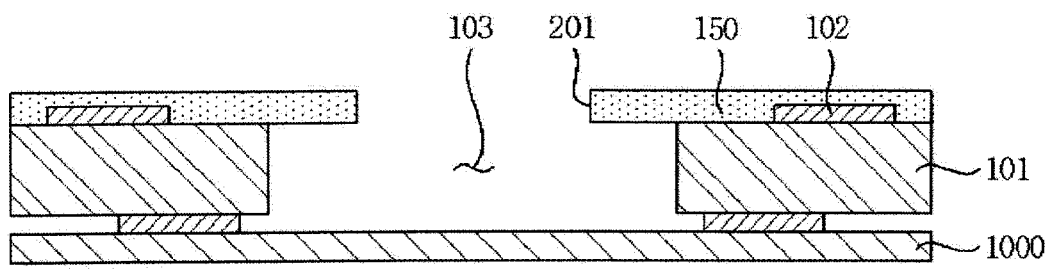
Figure 28:
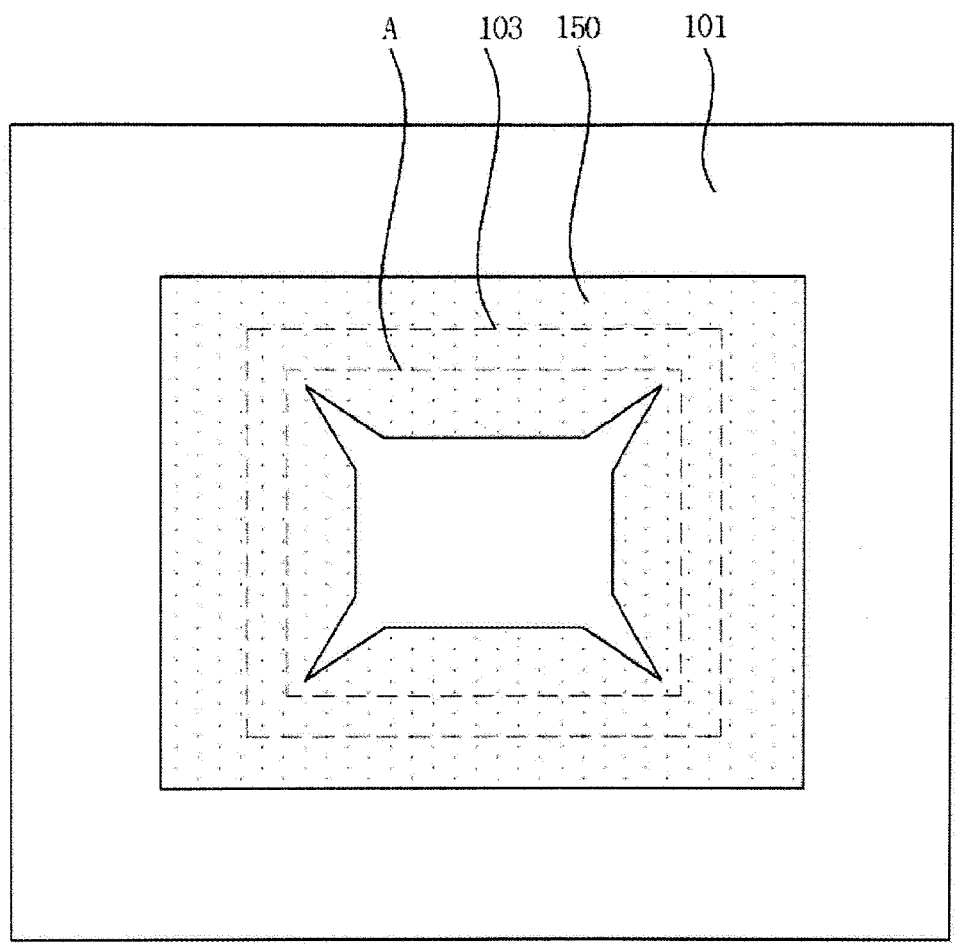

In one example, the opening 201 of the insulating member 150 has, for example, a radial shape (see FIGS. 26 through 28). In another example, the opening 201 of the insulating member 150 also has through-holes P (see FIG. 26) formed at the tips of the radial shape and corresponding to alignment marks (not illustrated) of the electronic element 300.

The electronic element 300 is fixed in a desired position by contacting boundaries of the opening 201, while being inserted into the opening 201. Therefore, a position matching rate of the electronic element is improved.

According to an embodiment, the insulating member 150 including the opening 201, as described above, is used to alleviate stress in a lower portion of the electronic element 300 when the electronic element 300 is accommodated in the cavity such that the main surface thereof is directly downwardly. As a result, contraction stress is decreased after the electronic element is embedded in the core board. Furthermore, warpage is suppressed, and controlling warpage of the overall printed circuit board is facilitated.

Once the electronic element 300 is in place, the insulating member 150 has a curved portion contacting at least a portion of the side surfaces of the electronic element 300.

While a portion of the insulating member 150 is curved to contact the side surfaces of the electronic element 300 and fix the electronic element 300; thus, controlling warpage generated in the printed circuit board when the electronic element 300 is accommodated in the cavity in a manner such that the main surface thereof is directly downwardly.

The insulating member 150 is formed of an insulating material having a modulus of elasticity lower than those of the insulating layer 101 and the second insulating layer 250. For example, a resin having a low modulus of elasticity is used.

For example, the modulus of elasticity of the insulating member 150 is about $\frac{1}{10}$ or less of that of the second insulating layer 250. For example, the insulating member 150 has a modulus of elasticity of about 10 GPa or less.

Since the insulating member 150 has a lower modulus of elasticity than the insulating layer 101 of the printed circuit board, the insulating member 150 is flexible and not significantly affected by contraction of the insulating layer 101 of the core board, of the printed circuit board. As a result, the insulating member 150 serves to control warpage of the printed circuit board.

The insulating member 150 is formed of an insulating material having a coefficient of thermal expansion lower than that of the second insulating layers 250. For example, a resin having a low coefficient of thermal expansion is used.

As described above, the insulating member 150 has the coefficient of thermal expansion lower than that of the second insulating layers 250 to control warpage generated when the electronic element 300 is accommodated in the cavity in a manner such that the main surface of the electronic element 300 is directed downwardly.

The second insulating layers 250 are formed on both surfaces of the core board to cover the electronic element 300 accommodated in the cavity 103. The second insulating layers 250 are formed of any insulating resin generally used as an interlayer insulating material in the printed circuit board. For example, the second insulating layers 250 are formed of a thermosetting resin such as an epoxy resin, a thermoplastic resin, such as polyimide, or a resin prepared by impregnating a reinforcing material such as a glass fiber or an inorganic filler with the thermosetting resin or the thermoplastic resin may be used. For example, the second insulating layer may be formed of a resin, such as a prepreg, ABF, FR-4, or BT.

Meanwhile, although not illustrated, a build-up layer is formed on the second insulating layers 250, and vias connecting the build-up layer to the circuit pattern 102 or the electronic element 300 are formed.

Furthermore, another device or electronic structural package is mounted in the printed circuit board, and the printed circuit board is also mounted on a main board.

In this case, the printed circuit board serves to electrically connect another device or electronic structural package to the main board.

Figure 6:
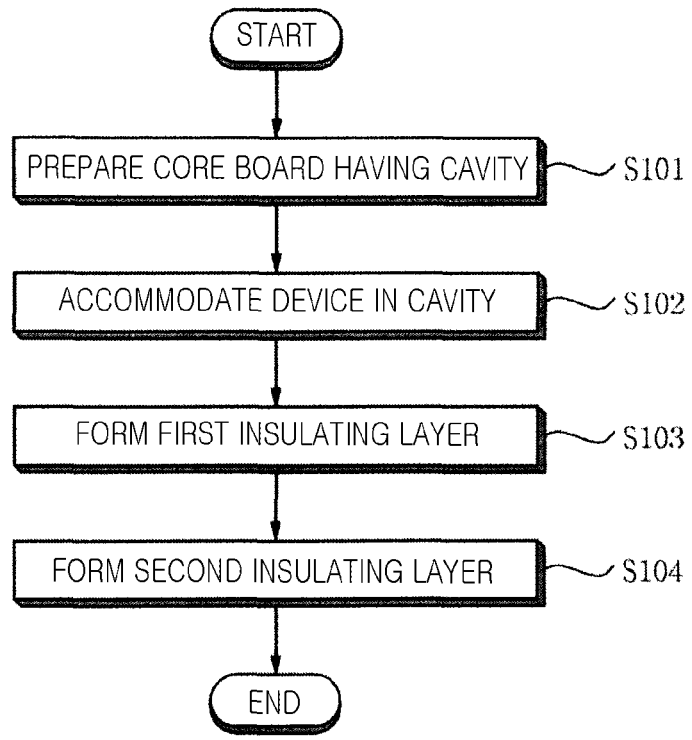
FIG. 6 is a flowchart illustrating a method to manufacture a printed circuit board, according to an embodiment.

FIG. 6 is a flowchart illustrating a method to manufacture a printed circuit board, according to an embodiment. FIGS. 7 through 13 are cross-sectional views sequentially illustrating a method to manufacture a printed circuit board, according to an embodiment.

Referring to FIG. 6, the method to manufacture a printed circuit board includes, at operation S101, preparing a core board having a cavity, and at operation S102, embedding an electronic element in the cavity. At operation S103, the method is configured to form an insulating member between inner surfaces of the cavity and the electronic element. In addition, at operation S104, the method is configured to form a second insulating layer on the core board.

Hereinafter, respective operations will be described with reference to the cross-sectional views of FIGS. 7 through 13.

Figure 7:
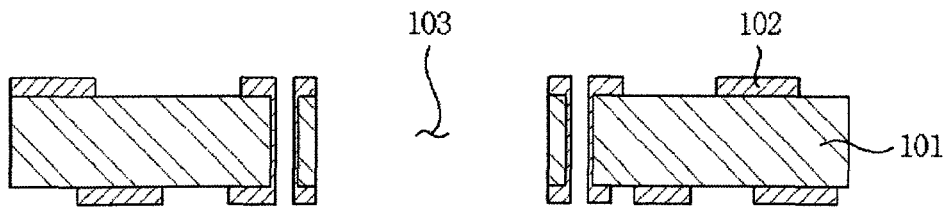
FIGS. 7 through 13 are cross-sectional views sequentially illustrating the method to manufacture a printed circuit board, according to the embodiment.

Referring to FIG. 7, a core board including a cavity 103 may be prepared.

The core board includes an insulating layer 101 and circuit patterns 102 formed on the insulating layer 101.

The cavity 103 of the core board is a region to accommodate an electronic element 300 therein, and a size and a shape of the cavity 103 is determined by considering dimensions or structural specifications, including clearances, of the electronic element 300.

A method of forming the cavity 103 is not particularly limited, but may be, for example, mechanical drilling, laser processing, or other forming method.

Figure 8:
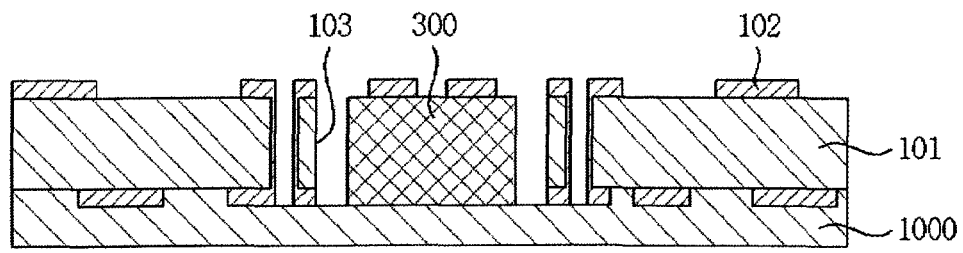

Next, referring to FIG. 8, an adhesive sheet 1000 is attached onto one surface of the core board, and the electronic element 300 is embedded in the cavity 103.

The adhesive sheet 1000 is a support on which the core board and the electronic element 300, which is to later be inserted into the core board, are stably placed. In one configuration, the adhesive sheet 1000 is formed of any material that serves as the support and may be easily attached and detached.

For example, an adhesive member in which adhesion is lost when heat is applied thereto to exhibit non-adhesive characteristics may be used as the adhesive sheet 1000. In this case, the core board is easily fixed, and is easily removed through a heat treatment. An example of an adhesive configured to exhibit non-adhesive characteristics when heat-treated includes a urethane foam tape, but is not limited thereto.

The electronic element 300 is accommodated in the cavity in such a manner that the main surface thereof is directed upwardly.

The electronic element 300 is an electronic component electrically connected to the printed circuit board to perform a predetermined function. For example, the electronic element 300 is an electronic component, such as an integrated circuit (IC) chip, that is embedded in the printed circuit board. In an embodiment, electrodes are formed on an upper surface of the electronic element 300 to form electrical connections between the printed circuit board and the electronic element 300.

Although devices having structures known in the art are not specifically illustrated in the drawings, it would be obvious to those skilled in the art to configure other electronic devices that may be embedded in printed circuit boards.

Figure 9:
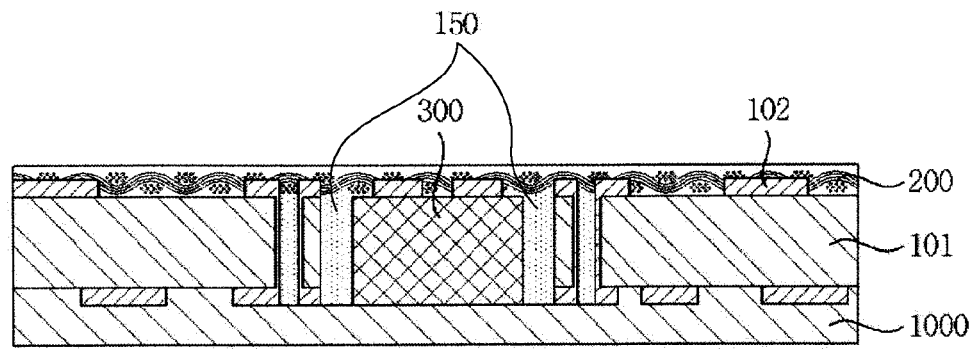

Next, referring to FIG. 9, a first insulating layer 200 is formed on an upper surface of the core board through V-lamination or the like.

In one example, the first insulating layer 200 is formed to cover the entirety of the upper surface of the core board, including the circuit pattern 102, the insulating member 150, and the electronic element 300, or is formed on a portion of the upper surface of the core board.

The first insulating layer 200 bonded to the upper surface of the core board is formed between the circuit patterns 102 of the core board, and a portion thereof is formed over the insulating member 150, in a space between the inner surfaces of the cavity 103 and the electronic element 300.

The first insulating layer 200 is formed of a glass fiber impregnated with resin having a modulus of elasticity lower than that of the insulating layer 101.

In one example, in a case in which the first insulating layer 200 is formed of the glass fiber impregnated with resin, only the resin is melted and flows down through the V-lamination to fill the space between the inner surfaces of the cavity 103 and the side surfaces of the electronic element 300. As a result, the insulating member 150 formed in the space between the inner surfaces of the cavity 103 and the side surfaces of the electronic element 300 does not contain a glass fiber, and the first insulating layer 200 formed on the upper surface of the core board contains the glass fiber.

According to an embodiment, the insulating member 150 and the first insulating layer 200, including the low modulus of elasticity, fix or secure the electronic element 300 and serves to prevent the generation of warpage in the printed circuit board. The warpage is generated during a heat treatment and a cooling operation after the heat treatment in a process to manufacture the printed circuit board.

Furthermore, a general insulating material contracts during cooling after the heat treatment. As a result, the warpage of the circuit board may occur. However, the insulating member 150 has the low modulus of elasticity, thereby controlling the warpage of the printed circuit board.

Figure 10:
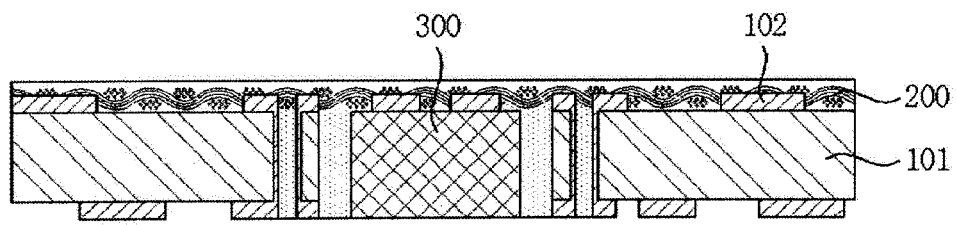
Figure 11:
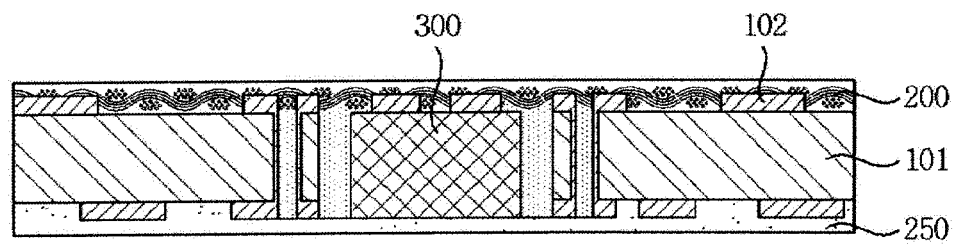

Referring to FIG. 10, the adhesive sheet 1000 is removed. Referring to FIG. 11, a second insulating layer 250 is formed on the lower surface of the core board on which the insulating member 150 is not formed.

In one example, plasma cleaning is selectively performed after the adhesive sheet 1000 is removed and before the second insulating layer 250 is formed.

The second insulating layer 250 is formed of any insulating resin generally used as an interlayer insulating material of the printed circuit board, and has a modulus of elasticity and a coefficient of thermal expansion higher than those of the insulating member 150 and the first insulating layer 200.

The second insulating layer 250 is formed of a thermosetting resin, such as an epoxy resin, a thermoplastic resin, such as polyimide, or a resin prepared by impregnating a reinforcing material, such as a glass fiber or an inorganic filler with the thermosetting resin, or the thermoplastic resin. For example, the second insulating layer 250 is formed of a resin, such as a prepreg, ABF, FR-4, or BT.

Figure 12:
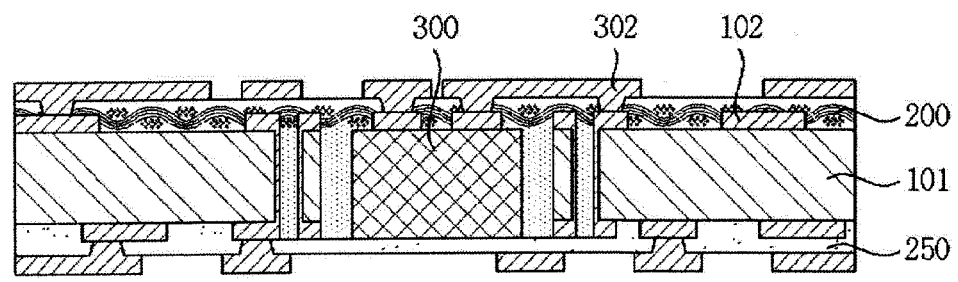

Referring to FIG. 12, build-up circuit patterns 302 are formed on the first insulating layer 200 and the second insulating layer 250.

The build-up circuit pattern 302 is formed by a general circuit forming method. For example, the build-up circuit pattern 302 is formed by a semi-additive process (SAP), in which electroless plating and electroplating are used.

In one example, the build-up circuit pattern 302 includes vias connecting the build-up circuit pattern 302 to the circuit pattern 102 of the core board or the electronic element 300.

Figure 13:
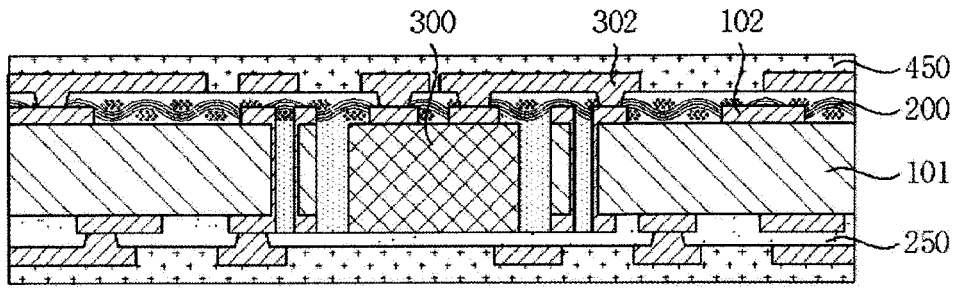

Referring to FIG. 13, build-up insulating layers 450 are formed on the build-up circuit patterns 302.

The build-up insulating layer 450 is formed of any insulating resin generally used as an interlayer insulating material of the printed circuit board. For example, an insulating material, which is the same as that of the second insulating layer 250 may be used to form the build-up insulating layer 450.

The build-up insulating layer 450 has a modulus of elasticity and a coefficient of thermal expansion higher than those of the first insulating layer 200.

Figure 14:
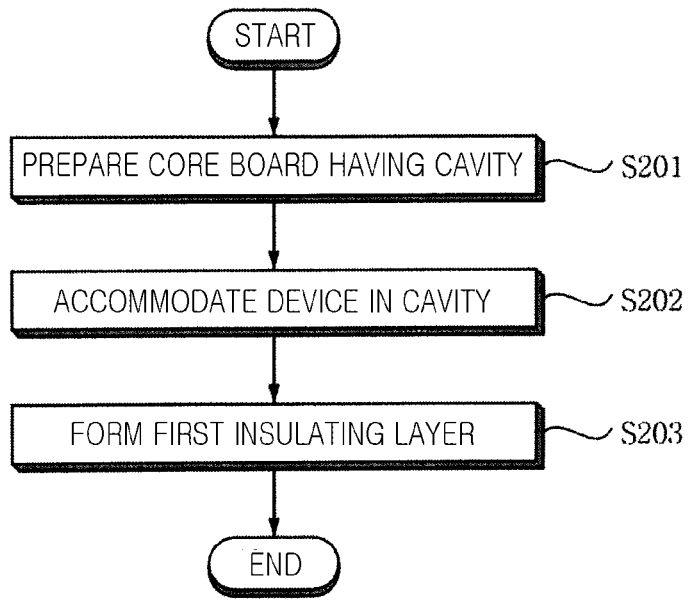
FIG. 14 is a flowchart illustrating a method to manufacture a printed circuit board, according to another embodiment.

FIG. 14 is a flowchart illustrating a method to manufacture a printed circuit board, according to another embodiment. FIGS. 15 through 21 are cross-sectional views sequentially illustrating the method to manufacture a printed circuit board, according to an embodiment.

Referring to FIG. 14, the method to manufacture a printed circuit board includes, at operation S201, preparing a core board having a cavity. At operation S202, the method embeds an electronic element in the cavity, and, at operation S203, forms first insulating layers on both surfaces of the core board.

Hereinafter, respective operations will be described with reference to the cross-sectional views of FIGS. 15 through 21.

Figure 15:
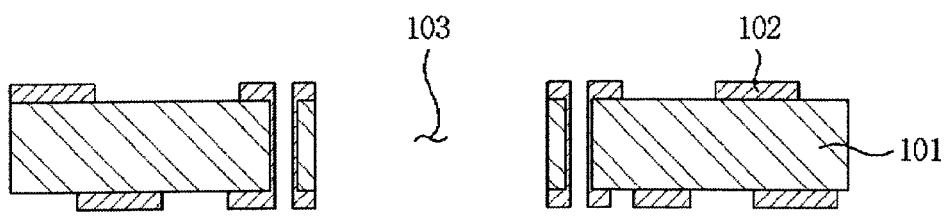
FIGS. 15 through 21 are cross-sectional views sequentially illustrating a method to manufacture a printed circuit board, according to the embodiment.

Referring to FIG. 15, a core board including a cavity 103 may be prepared. The core board includes an insulating layer 101 and circuit patterns 102 formed on the insulating layer 101.

Figure 16:
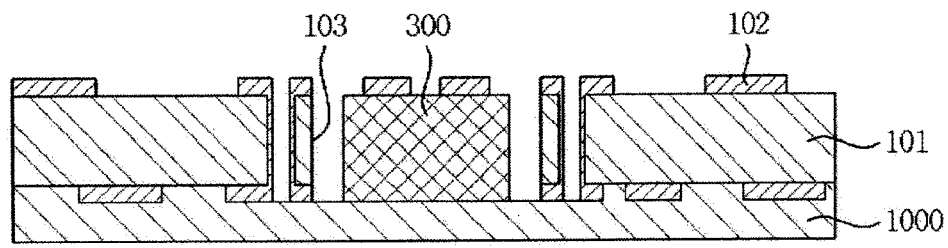

Referring to FIG. 16, an adhesive sheet 1000 is attached to one surface of the core board, and an electronic element 300 is embedded in the cavity 103.

The electronic element 300 is accommodated in the cavity in a manner such that the main surface thereof is directed upwardly.

Figure 17:
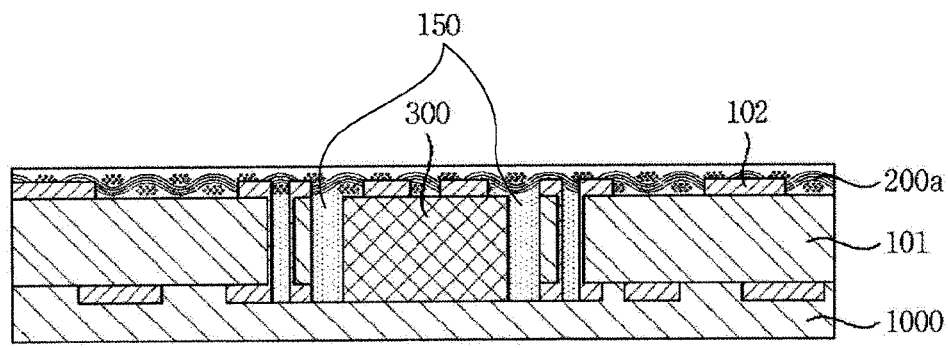

Referring to FIG. 17, an upper first insulating layer 200a is formed on an upper surface of the core board through V-lamination or the like.

The upper first insulating layer 200a is formed to cover the entirety of the upper surface of the core board or is formed on a portion of the upper surface of the core board.

The upper first insulating layer 200a bonded to the upper surface of the core board is formed between the circuit patterns 102 of the core board, and a portion of the upper first insulating layer 200a is formed over an insulating member 150 in a space between the inner surfaces of the cavity 103 and the electronic element 300.

The upper first insulating layer 200a is formed of a glass fiber impregnated with resin having a modulus of elasticity lower than that of the insulating layer 101.

In an example in which the material of the upper first insulating layer 200a is formed of a glass fiber impregnated with resin, only the resin is melted and flows down through the V-lamination to fill the space between the inner surfaces of the cavity 103 and the side surfaces of the electronic element 300. As a result, the insulating member 150 formed in the space between the inner surfaces of the cavity 103 and the side surfaces of the electronic element 300 does not contain a glass fiber, and the first insulating layer 200a formed on the upper surface of the core board contains a glass fiber.

Figure 18:
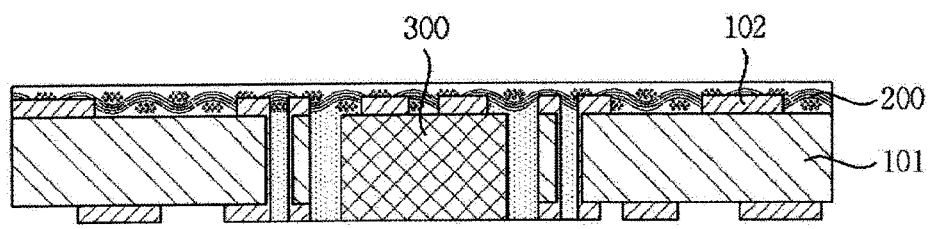
Figure 19:
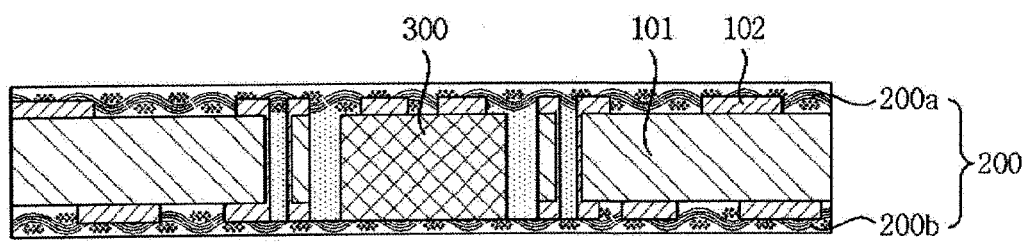

Referring to FIG. 18, the adhesive sheet 1000 is removed. Referring to FIG. 19, a lower first insulating layer 200b is formed on the lower surface of the core board.

The lower first insulating layer 200b formed on the lower surface of the core board is formed of a glass fiber impregnated with resin.

Here, plasma cleaning may be selectively performed after the adhesive sheet 1000 is removed and before the first insulating layer 200b is formed.

According to an embodiment, the insulating member 150 and/or the upper and lower first insulating layers 200a and 200b include the low modulus of elasticity fix or secure the electronic element 300 and prevent the generation of warpage during cooling after heat treatment.

Furthermore, a general insulating material contracts during cooling after the heat treatment. As a result, the warpage of the circuit board occurs. However, the insulating member 150 and the upper and lower first insulating layers 200a and 200b have the low modulus of elasticity to control the warpage of the printed circuit board.

Figure 20:
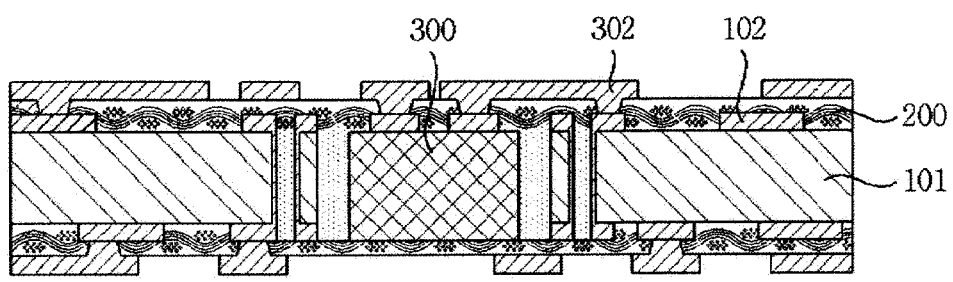

Next, referring to FIG. 20, build-up circuit patterns 302 are formed on the upper and lower first insulating layers 200a and 200b.

The build-up circuit pattern 302 is formed through a general circuit forming method. For example, the build-up circuit pattern 302 is formed by a SAP in which electroless plating and electroplating are used.

In one example, the build-up circuit pattern 302 includes vias connecting the build-up circuit pattern 302 to the circuit patterns 102 of the core board or the electronic element 300.

Figure 21:
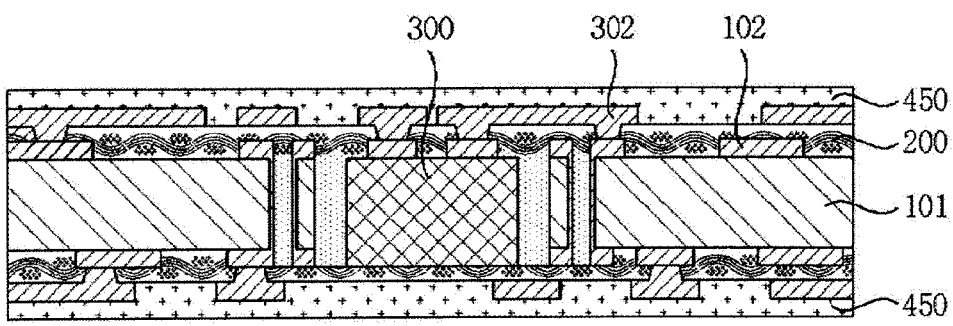

Referring to FIG. 21, build-up insulating layers 450 are formed on the build-up circuit patterns 302.

The build-up insulating layer 450 is formed of any insulating resin generally used as an interlayer insulating material of the printed circuit board. For example, an insulating material, which is the same as that of the second insulating layer 250, may be used.

The build-up insulating layer 450 has a modulus of elasticity and a coefficient of thermal expansion higher than those of the first insulating layer 200.

Figure 22:
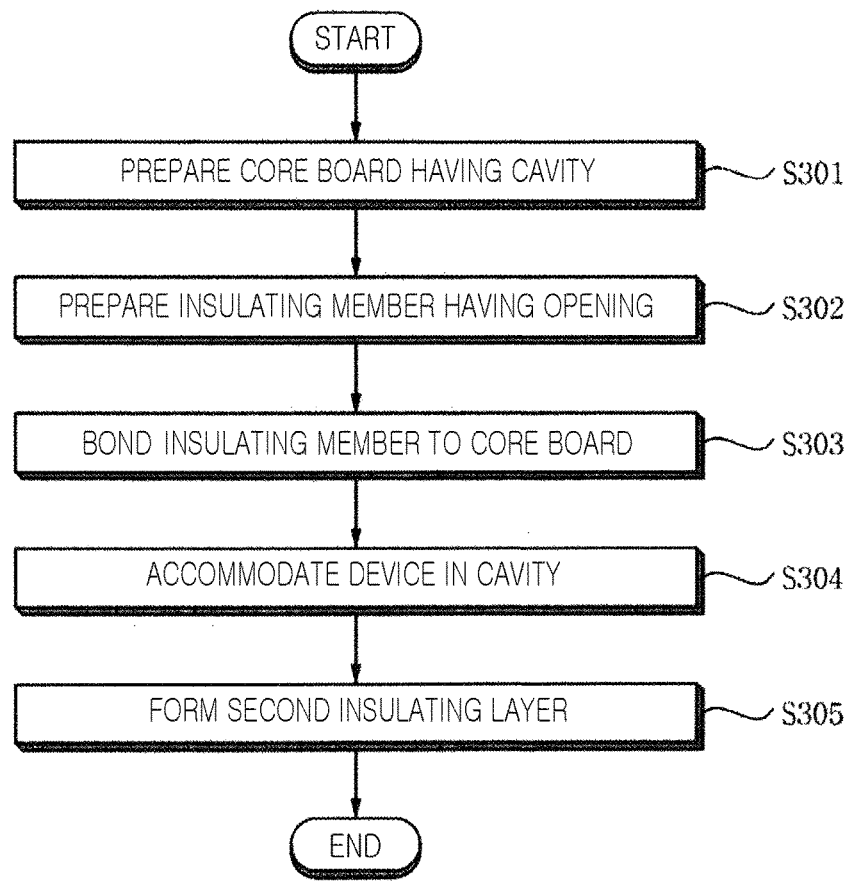
FIG. 22 is a flowchart illustrating a method to manufacture a printed circuit board, according to another embodiment.

FIG. 22 is a flowchart illustrating a method to manufacture a printed circuit board, according to another embodiment. FIGS. 23 through 30 are cross-sectional views sequentially illustrating the method to manufacture a printed circuit board, according to an embodiment.

Referring to FIG. 22, at operation S301, the method to manufacture printed circuit board includes preparing a core board having a cavity, and at operation S302, the method prepares an insulating member having an opening as a fixing member. At operation S303, the method bonds the insulating member to an upper surface of the core board, at operation S304, the method embeds an electronic element in the cavity through the opening, and, at operation S305, the method forms second insulating layers.

Hereinafter, respective operations will be described with reference to the cross-sectional views of FIGS. 23 through 30.

Figure 23:
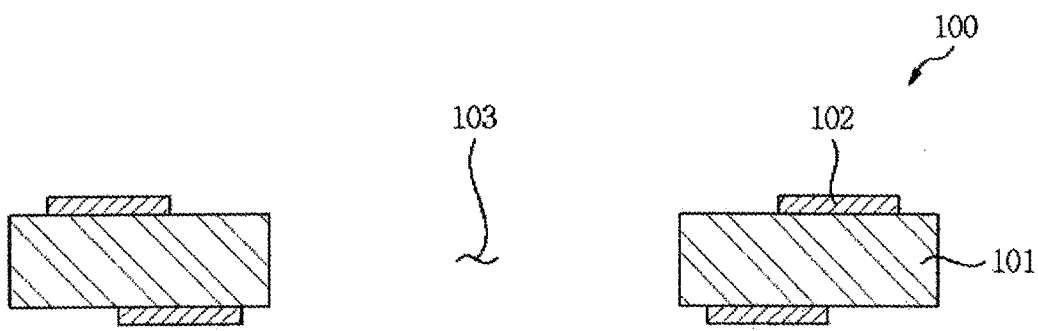
FIGS. 23 through 30 are cross-sectional views sequentially illustrating the method to manufacture a printed circuit board, according to the embodiment.

Referring to FIG. 23, a core board having a cavity 103 is prepared.

The core board 100 includes an insulating layer 101 and circuit patterns 102 formed on the insulating layer 101.

Figure 24:
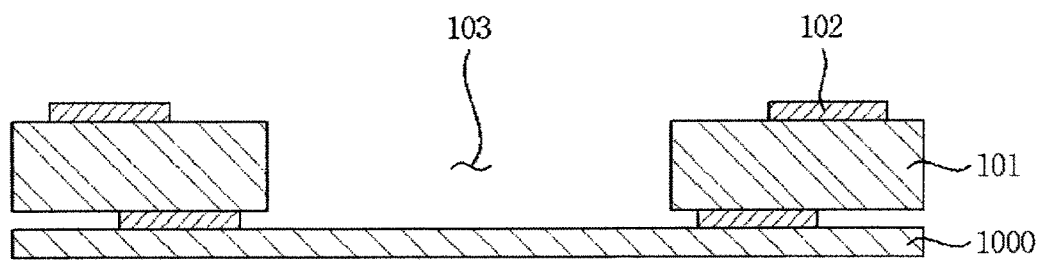

Referring to FIG. 24, an adhesive sheet 1000 is attached to one surface of the core board 100.

Figure 25:
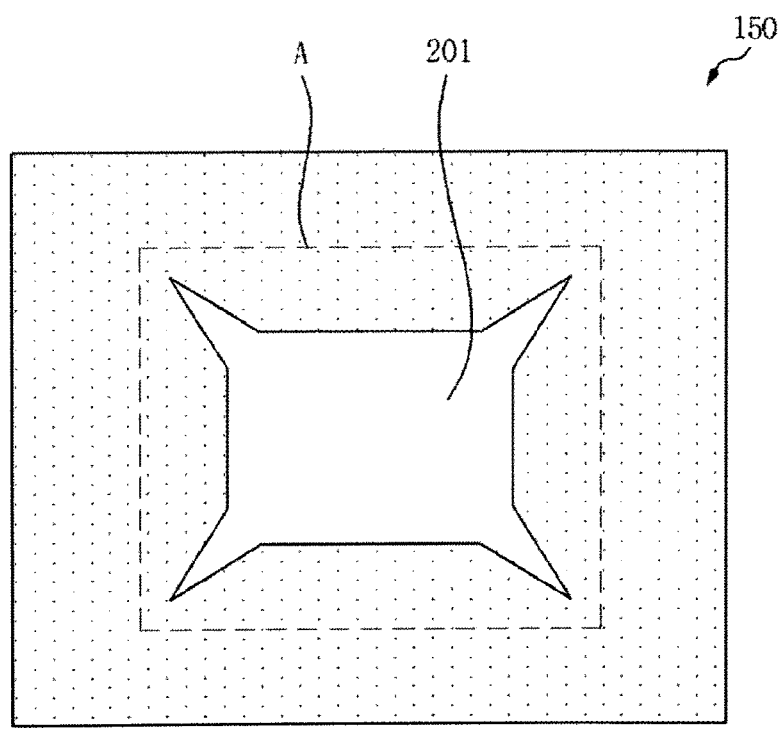

Referring to FIGS. 25 and 26, an insulating member 150 including an opening 201 is prepared.

A size and a shape of the opening 201 are determined by considering that the electronic element 300 may be fixedly inserted into the opening 201. According to an embodiment, the opening 201 has a radial shape in consideration of a size A of the electronic element. In addition, in a case in which alignment marks are present on the electronic element, through-holes P (see FIG. 26) corresponding to the alignment marks of the electronic element are formed at the tips of the radial shape of the opening 201.

The opening 201 is formed by, for example, punching.

Furthermore, the insulating member 150 is prepared in a semi-hardened state to be easily bonded to the core board later.

Referring to FIGS. 27 and 28, the insulating member 150 is bonded to the upper surface of the core board 100 through, for example, V-lamination, such that the opening 201 of the insulating member 150 is positioned in an upper portion of the cavity 103 of the core board.

In one configuration, the insulating member 150 may be formed to cover the entirety of the upper surface of the core board 100 or may be formed on a portion of the upper surface of the core board 100.

The insulating member 150 bonded to the upper surface of the core board 100 through the lamination is also formed between the circuit patterns 102 of the core board 100.

The insulating member 150 has a modulus of elasticity lower than that of the insulating layer 101 of the core board.

Figure 29:
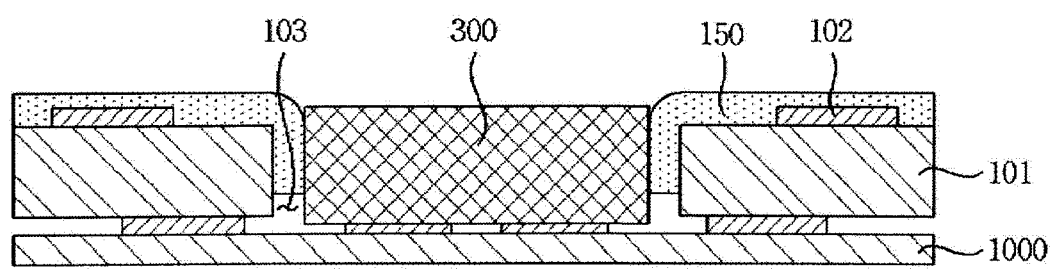

Referring to FIG. 29, the electronic element 300 is accommodated in and fixed to the cavity 103 of the core board through the opening 201 of the insulating member 150. In one example, after the electronic element 300 is accommodated in the cavity, the insulating material is hardened to secure or fix the electronic element 300.

The electronic element 300 is accommodated in the cavity in a manner such that the main surface thereof is directed downwardly.

The electronic element 300 is fixed by contacting the boundaries of the opening 201 of the insulating member 150. In addition, the insulating member 150 contacts the side surfaces of the electronic element 300 to be curved in a direction in which the electronic element 300 is inserted.

A portion of the insulating member 150 is curved to contact the side surfaces of the electronic element 300 and fix the electronic element 300 to control warpage generated in the printed circuit board.

Figure 30:
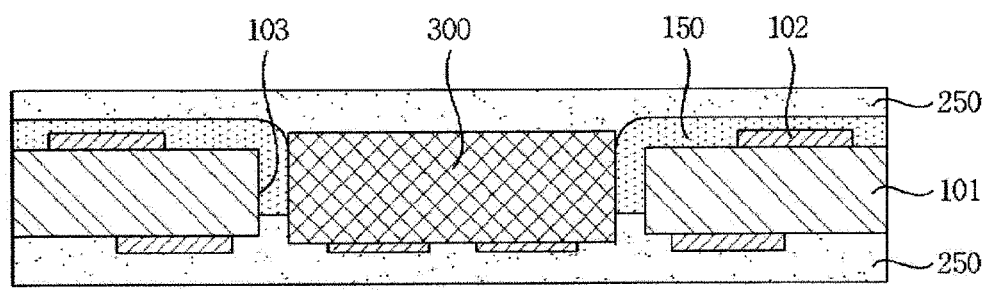

Referring to FIG. 30, the adhesive sheet 1000 is removed, and second insulating layers 250 are simultaneously formed on both surfaces of the core board 100 in which the electronic element 300 has been accommodated.

In one example, plasma cleaning is selectively performed after the adhesive sheet 1000 is removed and before the second insulating layers 250 are formed.

The electronic element 300 is embedded in the core board by forming the second insulating layers 250 on both surfaces of the core board.

Further, although not illustrated, a build-up layer is formed on the second insulating layers 250, and vias connecting the build-up layer to the circuit patterns 102 of the core board or the electronic element 300 are formed.

In addition, another device or package is mounted in the printed circuit board, and the printed circuit board is also mounted on a main board. In this case, the printed circuit board electrically connects another device or package to the main board.

According to an embodiment, as soon as the electronic element is inserted into the core board, the insulating member fixes the electronic element and serves to prevent the generation of warpage in the printed circuit board. The warpage is generated in a heat treatment and a cooling operation after the heat treatment in a process to manufacture the printed circuit board.

Furthermore, a general insulating material, such as the second insulating layer, contracts during cooling after the heat treatment causing the warpage of the circuit board. However, the insulating member has a low modulus of elasticity to control the warpage of the printed circuit board.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a core board comprising an insulating layer, the insulating layer having a cavity formed therein;
   a first insulating layer disposed on a surface of the core board;
   a second insulating layer comprising a different material from the first insulating layer disposed on an opposite surface of the core board from the first insulating layer;
   an electronic element disposed in the cavity; and
   an insulating member disposed between inner surfaces of the cavity and the electronic element,
   wherein the second insulating layer is disposed in contact with the electronic element,
   a modulus of elasticity of the insulating member is lower than a modulus of elasticity of the first insulating layer,
   the electronic element has a surface on which electrodes are disposed,
   the first insulating layer comprises glass fiber impregnated with resin, and the glass fiber impregnated with resin is disposed in contact with the insulating layer of the core board and the surface of the electronic element on which the electrodes are disposed.

2. The printed circuit board of claim 1, further comprising another second insulating layer disposed on the first insulating layer.

3. The printed circuit board of claim 1, wherein the modulus of elasticity and a coefficient of thermal expansion of the insulating member are lower than a modulus of elasticity and a coefficient of thermal expansion of the second insulating layer.

4. The printed circuit board of claim 1, wherein the insulating member comprises a curved portion connected to the first insulating layer.

5. The printed circuit board of claim 1, wherein a modulus of elasticity and a coefficient of thermal expansion of the second insulating layer are higher than the modulus of elasticity and a coefficient of thermal expansion, respectively, of the first insulating layer.

6. The printed circuit board of claim 1, wherein a modulus of elasticity and a coefficient of thermal expansion of the second insulating layer are different from the modulus of elasticity and a coefficient of thermal expansion, respectively, of the first insulating layer, and
the second insulating layer comprises a thermosetting resin.

7. The printed circuit board of claim 1, further comprising:
a build-up layer disposed on the first insulating layer; and
vias connecting the build-up layer to the electrodes disposed on the surface of the electronic element.

8. The printed circuit board of claim 1, wherein the modulus of elasticity or a coefficient of thermal expansion of the first insulating layer is lower than a modulus of elasticity or a coefficient of thermal expansion of the insulating layer of the core board.

9. The printed circuit board of claim 2, wherein the modulus of elasticity and a coefficient of thermal expansion of either one or both of the insulating member and the first insulating layer are lower than a modulus of elasticity and a coefficient of thermal expansion of the second insulating layers.

10. A printed circuit board comprising:
a core board comprising an insulating layer, the insulating layer having a cavity formed therein;
a first insulating layer and a second insulating layer comprising a different material from the first insulating layer disposed on opposite surfaces of the core board;
an electronic element disposed in the cavity so that a first surface of the electronic element contacts the first insulating layer, a second surface of the electronic element contacts the second insulating layer, and side surfaces of the electronic element are spaced apart from the insulating layer of the core board; and
an insulating member disposed between the insulating layer of the core board and the side surfaces of the electronic element to secure the electronic member to the core board,
wherein a modulus of elasticity of the insulating member is lower than or equal to a modulus of elasticity of the first insulating layer,
the second insulating layer has a modulus of elasticity or a coefficient of thermal expansion higher than the modulus of elasticity or a coefficient of thermal expansion, respectively, of the first insulating layer,
the first surface of the electronic element has electrodes disposed thereon,
the first insulating layer comprises glass fiber impregnated with resin, and
the glass fiber impregnated with resin is disposed in contact with the insulating layer of the core board and the first surface of the electronic element on which the electrodes are disposed.

11. The printed circuit board of claim 10, wherein the modulus of elasticity and a coefficient of thermal expansion of the insulating member are lower than the modulus of elasticity and the coefficient of thermal expansion, respectively, of the first insulating layer, and are lower than the modulus of elasticity and the coefficient of thermal expansion, respectively, of the second insulating layer.

12. The printed circuit board of claim 10, wherein the modulus of elasticity and a coefficient of thermal expansion of the insulating member are equal to the modulus of elasticity and the coefficient of thermal expansion, respectively, of the first insulating layer, and are lower than the modulus of elasticity and the coefficient of thermal expansion, respectively, of the second insulating layer.

13. The printed circuit board of claim 10, wherein the modulus of elasticity and a coefficient of thermal expansion of the insulating member are lower than the modulus of elasticity and the coefficient of thermal expansion, respectively, of the second insulating layer.

14. The printed circuit board of claim 10, further comprising another first insulating layer disposed between the second insulating layer and the opposite surface of the core board to cover another surface of the electronic element.

* * * * *